(12) United States Patent
Larouche et al.

(10) Patent No.: US 7,107,570 B1
(45) Date of Patent: Sep. 12, 2006

(54) METHOD AND SYSTEM FOR USER-DEFINED TRIGGERING LOGIC IN A HARDWARE DESCRIPTION LANGUAGE

(75) Inventors: Mario Larouche, Portland, OR (US); Chun Kit Ng, Portland, OR (US)

(73) Assignee: Synplicity, Inc., Sunnyvale, CA (US)

( * ) Notice: Subject to any disclaimer, the term of this patent is extended or adjusted under 35 U.S.C. 154(b) by 330 days.

(21) Appl. No.: 10/822,192

(22) Filed: Apr. 8, 2004

(51) Int. Cl.
*G06F 17/50* (2006.01)
*G06F 11/00* (2006.01)

(52) U.S. Cl. .............................. 716/18; 716/4; 703/16; 714/30

(58) Field of Classification Search ..................... None
See application file for complete search history.

(56) References Cited

U.S. PATENT DOCUMENTS 6,581,191 B1  6/2003  Schubert et al.
7,010,672 B1 * 3/2006  Ahmad et al. .............. 712/227
2004/0250164 A1 * 12/2004 Ahmad et al. ................ 714/30

* cited by examiner

*Primary Examiner*—Leigh M. Garbowski
(74) *Attorney, Agent, or Firm*—Blakely, Sokoloff, Taylor & Zafman LLP

(57) ABSTRACT

A method and system for user-defined triggering logic in a hardware description language is described. The method includes reading a file containing user-defined triggering logic described in a hardware description language (HDL), inserting and connecting the triggering logic to a circuit described in HDL, and compiling the HDL description of the circuit to generate a register transfer level (RTL) netlist.

22 Claims, 3 Drawing Sheets

METHOD AND SYSTEM FOR USER-DEFINED TRIGGERING LOGIC IN A HARDWARE DESCRIPTION LANGUAGE

BACKGROUND

1. Technical Field

Embodiments of the invention relate to the field of debugging electronic circuits, and more specifically to user-defined triggering logic in a hardware description language.

2. Background Information and Description of Related Art

For the design of digital circuits, designers often employ computer aided techniques. Standard languages, such as Hardware Description Languages (HDLs), have been developed to describe digital circuits to aid in the design and simulation of complex digital circuits. As device technology continues to advance, various product design tools have been developed to adapt HDLs for use with newer devices and design styles.

After the HDL code is written and compiled, the design of an integrated circuit (IC) or a system which includes multiple ICs must be verified to be correct. Debugging applications have been developed to aid in the verification process. Using the debugging applications, designers may add logic to the circuits for debugging purposes. For example, triggering logic may be added to the circuits. The triggering logic detects when one or more defined triggering events of interest have occurred. The triggering events are triggered when one or more triggering conditions are met. Each triggering condition is defined by one or more states of one or more signals in the circuit. When a triggering event is detected, signals of interest may be sampled and captured for error detection and correction. The triggering logic may include one or more configurable registers that may be connected to a debugger during the verification process. The debugger allows for the programming of control signals via the configurable registers to trigger the triggering events of interest.

The debugging applications described above allow a user to specify the data signals that will trigger an event of interest. A limited number of predetermined parameters, such as width or whether the triggering logic will have a counter, a state machine, or complex comparators, may be selected by the user. After obtaining these parameters, the debugging applications will typically generate a triggering logic block that implements the logic and detects for the desired triggering events. Since the logic elements in the triggering block are determined and generated by the debugging application, the user is limited in the ability to customize the design of the triggering logic to meet the user's needs.

BRIEF DESCRIPTION OF DRAWINGS

The invention may best be understood by referring to the following description and accompanying drawings that are used to illustrate embodiments of the invention. In the drawings.

DETAILED DESCRIPTION

Embodiments of a system and method for user-defined triggering logic in a hardware description language are described. In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
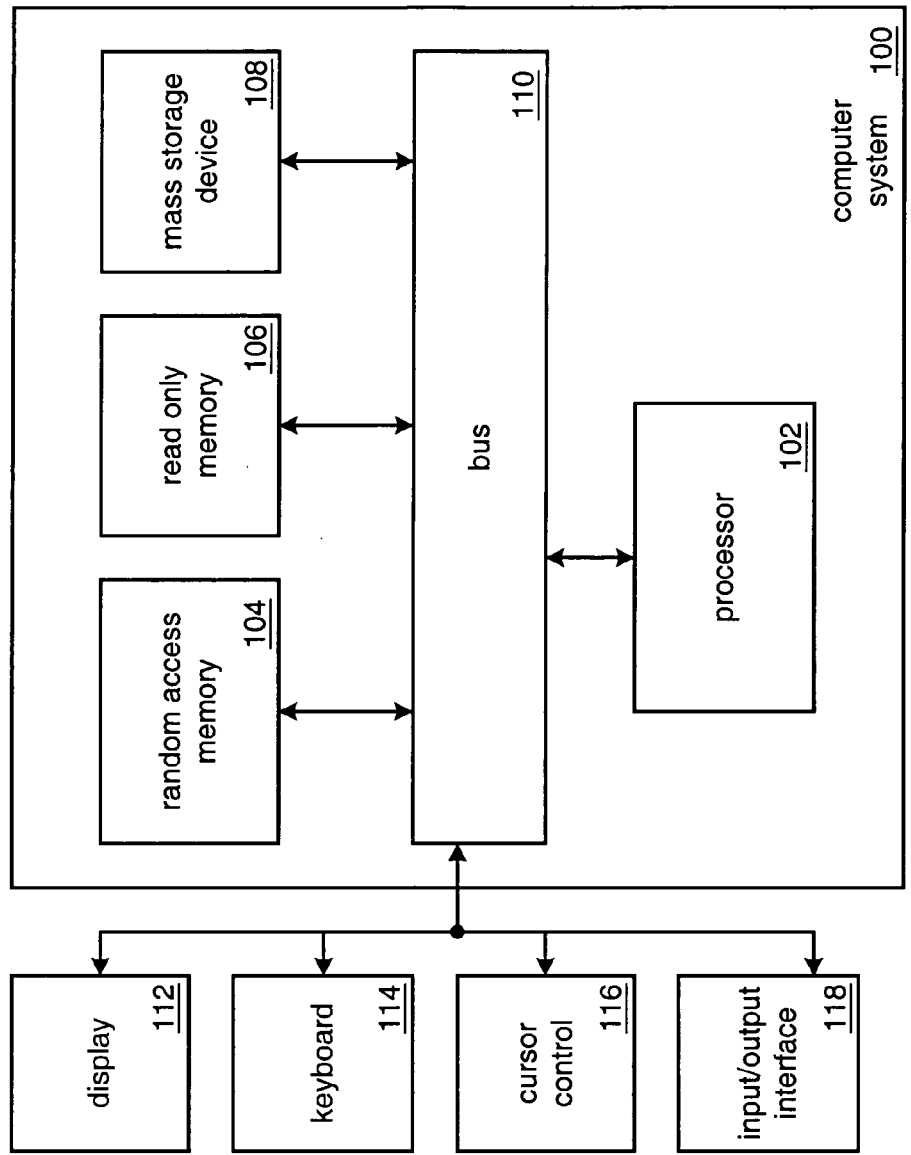
FIG. 1 illustrates a block diagram of a computer system that may be used to implement embodiments of the invention.

FIG. 1 illustrates a block diagram of a computer system 100 that may be used to implement an embodiment of the invention. The computer system 100 includes a processor 102 coupled through a bus 110 to a random access memory (RAM) 104, a read-only memory (ROM) 106, and a mass storage device 108. Mass storage device 108 represents a persistent data storage device, such a floppy disk drive, fixed disk drive (e.g. magnetic, optical, magneto-optical, or the like), or streaming tape drive. Processor 102 may be embodied in a general purpose processor, a special purpose processor, or a specifically programmed logic device.

Display device 112 is coupled to processor 102 through bus 110 and provides graphical output for computer system 100. Keyboard 114 and cursor control unit 116 are coupled to bus 110 for communicating information and command selections to processor 102. Also coupled to processor 102 through bus 110 is an input/output (I/O) interface 118, which can be used to control and transfer data to electronic devices (printers, other computers, etc.) connected to computer system 100.

It should be noted that the architecture of FIG. 1 is provided only for purposes of illustration, and that a computer used in conjunction with embodiments of the invention is not limited to this specific architecture.

As will be appreciated by those skilled in the art, the content for implementing an embodiment of a method of the invention, for example, computer program instructions, may be provided by any machine-readable media which can store data that is accessible by system 100, as part of or in addition to memory, including but not limited to cartridges, magnetic cassettes, flash memory cards, digital video disks, random access memories (RAMs), read-only memories (ROMs), and the like. In this regard, the system 100 is equipped to communicate with such machine-readable media in a manner well-known in the art.

It will be further appreciated by those skilled in the art that the content for implementing an embodiment of the method of the invention may be provided to the system 100 from any external device capable of storing the content and communicating the content to the system 100. For example, in one embodiment, the system 100 may be connected to a network, and the content may be stored on any device in the network.

Figure 2:
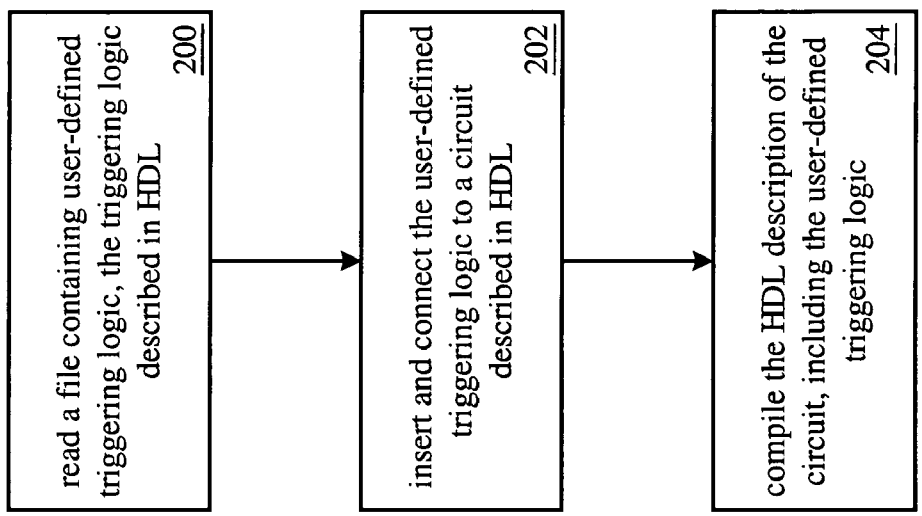
FIG. 2 is a flow diagram illustrating a method according to an embodiment of the invention.

FIG. 2 is a flow chart illustrating an embodiment of a method of the invention. A circuit may typically be described by writing Hardware Description Language (HDL) source code descriptions of the elements of the circuit. Writing HDL source code is well described in literature. See, for example, Verilog HDL: a Guide to Digital Design and Synthesis, Samir Palnithar, SunSoft Press, 1996; also see, A VHDL Synthesis Primer, J. Bhasher, Star Galaxy Publishing, 1996.

Circuit designers may add logic elements to the circuit to aid in the verification of the circuit. For instance, triggering logic may be added to debug the circuit. The triggering logic detects one or more triggering events of interest. Once a triggering event is detected, signals in the circuit may be sampled to detect errors in the circuit. The triggering events are generated when one or more triggering conditions are met. Each triggering condition is defined by one or more states of one or more signals in the circuit. The present invention allows users to customize the triggering logic by writing their own triggering logic in HDL.

The user describes the triggering logic in HDL and saves the HDL description in a file. The user may specify the name of the file containing the triggering logic description and the name of a top level block in the triggering logic that will connect to the circuit. Referring to FIG. 2, at 200, the file containing the user-defined triggering logic is read. At 202, the triggering logic is inserted and connected to the circuit. At 204, the HDL description of the circuit that includes the user-defined triggering logic is compiled.

One example of a compiler that may be used in compiling the HDL descriptions is a logic synthesis compiler, which is typically a computer program that operates on a general purpose computer system, although in some embodiments, the computer system may be a dedicated, special purpose computer system. An example of a logic synthesis compiler is the program "Synplify™" from Synplicity, Inc. of Sunnyvale, Calif. After compilation, a register transfer level (RTL) netlist may be generated. The RTL netlist usually shows registers and other logic interconnected to show the flow of data through a circuit that was described in the HDL.

In one embodiment of the invention, the RTL netlist is mapped to a target architecture. The target architecture is typically determined by a supplier of the integrated circuit (IC). Examples of target architectures include field programmable gate arrays (FPGAs) and complex programmable logic devices from vendors such as Altera, Lucent Technologies, Xilinx, and Lattice Semiconductor. The mapping operation converts the RTL level description of the desired circuit into the equivalent circuit implemented using building blocks of the target architecture. A technology specific netlist is generated. Conventional place and route software tools may then be used to create a design of circuitry in the target architecture.

Verification of the circuit may then be performed. Triggering events may be detected during the normal operation of the circuit. A debugger may be connected to the circuit to aid in the verification process. A debugger may program control signals via configurable registers in the triggering logic to trigger the triggering events. Once a triggering event is detected, signals of interest may be sampled and captured to detect circuit errors.

Figure 3:
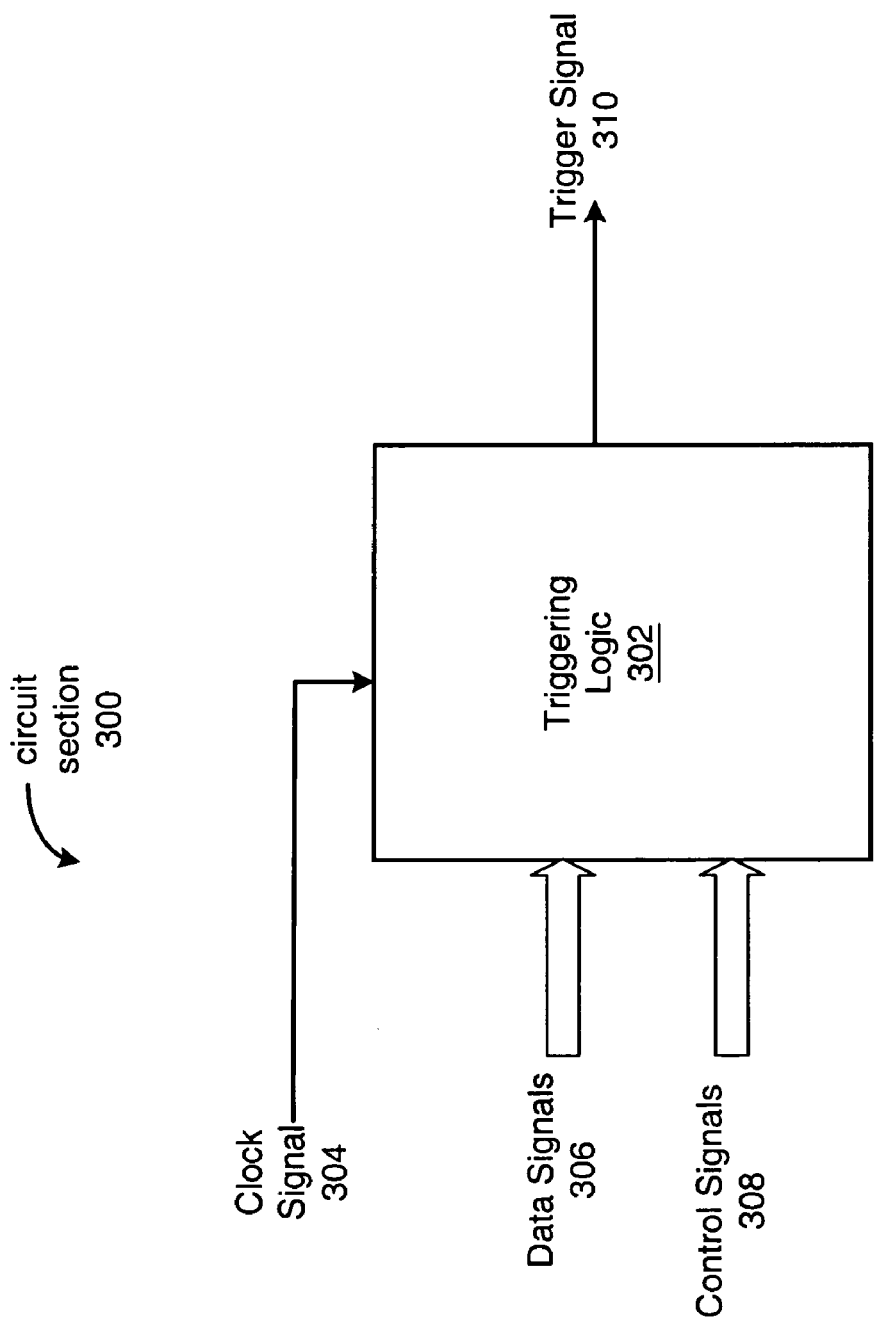
FIG. 3 is a block diagram illustrating a triggering logic block according to an embodiment of the invention.

FIG. 3 is a block diagram illustrating a circuit section 300 with a triggering logic block 302 according to an embodiment of the invention. The top level block of the triggering logic may have a predefined interface with a set of predetermined inputs and outputs. As shown in FIG. 3, the top level triggering logic block 302 has the following inputs: a clock signal 304, one or more data signals 306, and one or more control signals 308. A triggering event will be detected based on one or more states of one or more of the data signals 306. The control signals 308 may be connected to and programmed by a debugger during the circuit verification process. The triggering logic block 302 has one or more triggering signal outputs 310. The one or more triggering signal outputs 310 indicate whether the triggering logic has detected a triggering event.

An example of a HDL description of a triggering logic block written in Verilog is shown below for illustrative purposes.

```
//====================================================
module trig8 (clk, data, ctrl1, ctrl2, trig)
    /* synthesis syn_retain = 1 */
    /* synthesis syn_implement = "trig8" */
    /* synthesis debug_utu = 1 */
    ;
        input clk /* synthesis debug_utu_clock = 1 */;
        input [7:0] data;
        input [7:0] ctrl1 /* synthesis debug_utu_control = 1 */;
        input ctrl2 /* synthesis debug_utu_control = 1 */;
        output trig;
        reg trig;
        always @ (posedge clk)
        begin
            if (ctrl2 == 1'b1)
            begin
                if (data == ctrl1)
                begin
                    trig = 1;
                end
                else
                begin
                    trig = 0;
                end
            end
        end
endmodule
```

An example of a HDL description of a triggering logic block written in VHDL is shown below for illustrative purposes.

```
// ====================================================
library ieee;
use ieee.std_logic_1164.all;
use ieee.std_logic_unsigned.all;
entity trig8 is
    port(
        clk     :   in    std_logic;
        data    :   in    std_logic_vector (7 downto 0);
        ctrl1   :   in    std_logic_vector (7 downto 0);
        ctrl2   :   in    std_logic;
        trig    :   out   std_logic;
    );
    attribute debug_utu_control : boolean;
    attribute debug_utu_control of ctrl1 : signal is true;
    attribute debug_utu_control of ctrl2 : signal is true;
end trig8;
architecture rtl of trig 8 is
    attribute debug_utu : boolean;
    attribute debug_utu of rtl : architecture is true;
    attribute syn_retain : boolean;
    attribute syn_retain of rtl : architecture is true;
begin
    process (clk)
    begin
        if (rising edge (clk)) then
            trig <= '0';
            if (ctrl2 = '1') then
                if (data = ctrl1) then
                    trig <= '1';
                end if
            end if
        end if
    end process
end rtl
```

In both examples above, the name of the top level block of the triggering logic is "trig8". This block has inputs and outputs that match the predefined interface, as shown in FIG. 3 and described above. The inputs to the "trig8" triggering logic block are a one bit clock signal, "clk", an 8 bit data signal, "data", and two control signals, the 8 bit "ctrl1" and the one bit "ctrl2". The output signal is a one bit trigger signal, "trig". The triggering conditions are met if ctrl2 is equal to 1 and the data input signal is equal to ctrl1. These conditions are checked on every rising edge of the clk signal. If these conditions are met, the trig output signal will be 1, indicating that a triggering event has been detected by the triggering logic. Otherwise, the trig output signal will be 0, indicating that no triggering event has been detected. The control signals, ctrl1 and ctrl2, may be connected to a debugger during the verification process to program the signals to specific values in order to generate a triggering event.

After writing a HDL description of the desired triggering logic, such as the HDL descriptions shown above, the user saves the HDL description in a file. Assume that the user saves the HDL description in a file with the name "triggerlogic." Then, the user may specify the name of the file, "triggerlogic", and the name of the top level block to be connected to the circuit, "trig8", to the application. The file "triggerlogic," will be read, and the triggering logic defined in the file will be inserted and connected to the circuit.

The HDL descriptions of the circuit that include the triggering logic may then be input into a compiler. After compilation, a RTL netlist may be generated. In one embodiment of the invention, the RTL netlist is mapped to a target architecture. A technology specific netlist is generated. Conventional place and route software tools may then be used to create a design of circuitry in the target architecture. Verification of the circuit may then be performed. Triggering events may be detected during the normal operation of the circuit. A debugger is used to aid in the verification process. The control signals of the triggering logic may be programmed via the debugger to generate the triggering events. Once a triggering event is detected, signals of interest may be sampled and captured to detect circuit errors.

Thus, embodiments of a method and system for user-defined triggering logic in a hardware description language has been described. While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   reading a file containing user-defined triggering logic used to detect one or more triggering events, the triggering logic described in a hardware description language (HDL);
   inserting and connecting the user-defined triggering logic to a circuit described in HDL; and
   compiling the HDL description of the circuit that includes the user-defined triggering logic.

2. The method of claim 1, wherein compiling the HDL description of the circuit comprises compiling the HDL description of the circuit to generate a register transfer level (RTL) netlist.

3. The method of claim 2, further comprising mapping the RTL netlist to a selected technology architecture.

4. The method of claim 3, further comprising performing a place and route operation to implement the circuit in the selected technology architecture.

5. The method of claim 4, further comprising programming the RTL netlist into a programmable hardware device.

6. The method of claim 5, further comprising debugging the circuit on the programmable hardware device via a debugger.

7. The method of claim 1, wherein the triggering logic has a predetermined interface.

8. The method of claim 7, wherein the predetermined interface includes a clock signal input.

9. The method of claim 7, wherein the predetermined interface includes one or more data signal inputs.

10. The method of claim 7, wherein the predetermined interface includes one or more control signal inputs.

11. The method of claim 10, wherein the one or more control signals are programmable via a debugger.

12. The method of claim 7, wherein the predetermined interface includes one or more outputs to indicate whether the triggering logic has detected a triggering event.

13. The method of claim 1, wherein the triggering logic described in HDL is written by a user and a name of the file is specified by the user.

14. The method of claim 13, wherein the user further specifies a name of a top level triggering logic block defined in the file to be connected to the circuit.

15. An article of manufacture comprising:
   a machine accessible medium including content that when accessed by a machine causes the machine to perform operations comprising:
   reading a file containing user-defined triggering logic used to detect one or more triggering events, the triggering logic described in a hardware description language (HDL);
   inserting and connecting the triggering logic to a circuit described in HDL; and
   compiling the HDL description of the circuit, including the user-defined triggering logic, to generate a register transfer level (RTL) netlist.

16. The article of manufacture of claim 15, wherein the machine-accessible medium further includes content that causes the machine to perform operations comprising mapping the RTL netlist to a selected technology architecture.

17. The article of manufacture of claim 16, wherein the machine-accessible medium further includes content that causes the machine to perform operations comprising performing a place and route operation to implement the circuit in the selected technology architecture.

18. The article of manufacture of claim 17, wherein the machine-accessible medium further includes content that causes the machine to perform operations comprising programming the RTL netlist into a programmable hardware device.

19. A computer system comprising:
   a bus;
   a data storage device coupled to the bus; and
   a processor coupled to the data storage device, the processor operable to receive instructions which, when executed by the processor, cause the processor to perform a method comprising:
   reading a file containing user-defined triggering logic used to detect one or more triggering events, the triggering logic described in a hardware description language (HDL);

inserting and connecting the triggering logic to a circuit described in HDL; and compiling the HDL description of the circuit, including the user-defined triggering logic, to generate a register transfer level (RTL) netlist.

20. The computer system of claim 19, wherein the method further comprises mapping the RTL netlist to a selected technology architecture.

21. The computer system of claim 20, wherein the method further comprises performing a place and route operation to implement the circuit in the selected technology architecture.

22. The computer system of claim 21, wherein the method further comprises programming the RTL netlist into a programmable hardware device.

* * * * *